United States Patent
Jeon et al.

(10) Patent No.: US 7,429,766 B2
(45) Date of Patent: Sep. 30, 2008

(54) SPLIT GATE TYPE NONVOLATILE MEMORY DEVICE

(75) Inventors: Hee-Seog Jeon, Hwaseong-si (KR); Seung-Beom Yoon, Suwon-si (KR); Jeong-Uk Han, Suwon-si (KR); Yong-Tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 11/413,640

(22) Filed: Apr. 28, 2006

(65) Prior Publication Data

US 2006/0244042 A1    Nov. 2, 2006

(30) Foreign Application Priority Data

Apr. 29, 2005    (KR) .................... 10-2005-0036006

(51) Int. Cl.
 *H01L 29/788* (2006.01)
(52) U.S. Cl. .................. 257/317; 257/316; 257/315; 257/E21.682; 257/E21.103; 438/257; 438/258; 438/593
(58) Field of Classification Search ......... 257/315–317; 438/257–258, 593–594
See application file for complete search history.

(56) References Cited

U.S. PATENT DOCUMENTS

| 6,147,379 | A | 11/2000 | Hori et al. ................. 257/317 |
| 6,190,968 | B1 | 2/2001 | Kalnitsky et al. ........... 438/259 |
| 6,312,989 | B1 | 11/2001 | Hsieh et al. ................ 438/257 |
| 2003/0038313 | A1* | 2/2003 | Furuhata ..................... 257/296 |

FOREIGN PATENT DOCUMENTS

JP    07-115142    5/1995

* cited by examiner

*Primary Examiner*—Dung A. Le
(74) *Attorney, Agent, or Firm*—Mills & Onello LLP

(57) ABSTRACT

In a split gate type nonvolatile memory device, a supplementary layer pattern is disposed on a source region of a semiconductor substrate. Since the source region is vertically extended by virtue of the presence of the supplementary layer pattern, it is therefore possible to increase an area of a region where a floating gate overlaps the source region and the supplementary layer pattern. Accordingly, the capacitance of a capacitor formed between the source and the floating gate increases so that it is possible for the nonvolatile memory device to perform program/erase operations at a low voltage level.

12 Claims, 7 Drawing Sheets

Fig. 1
(Conventional)
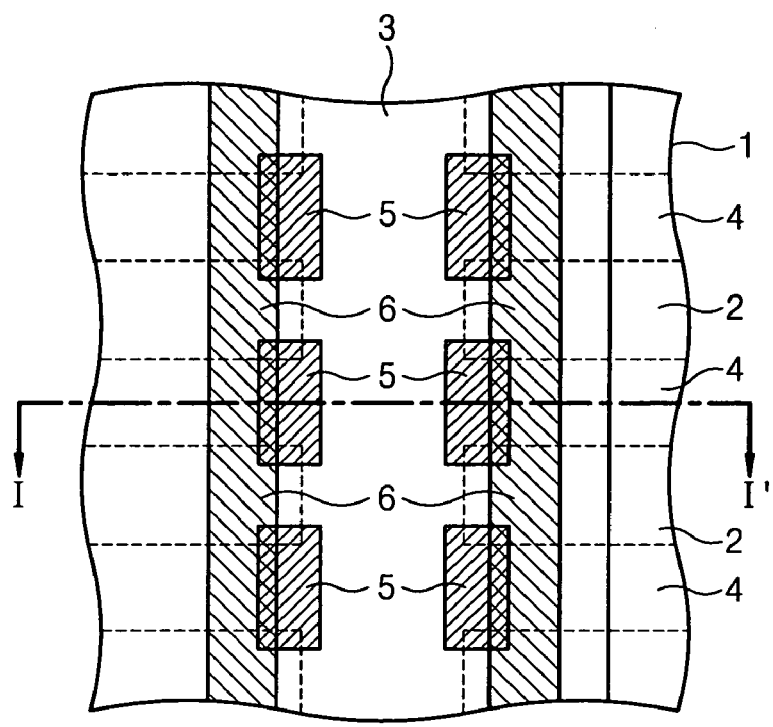
Fig. 2
(Conventional)
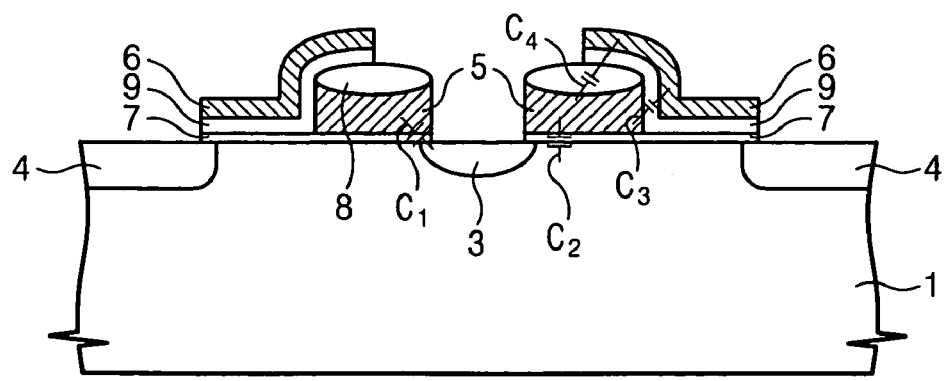

SPLIT GATE TYPE NONVOLATILE MEMORY DEVICE

CROSS REFERENCE TO RELATED APPLICATION

This application claims priority to Korean Patent Application No. 2005-0036006 filed on Apr. 29, 2005, the contents of which are incorporated herein by reference in their entirety.

BACKGROUND OF THE INVENTION

1. Field of the Invention

The present invention relates to a nonvolatile semiconductor memory device, and more particularly, to a split gate type nonvolatile memory device and a method of fabricating the same.

2. Description of the Related Art

Generally, semiconductor memory devices can be classified as volatile memory devices and nonvolatile memory devices. Stored data is lost in a volatile memory device when power is removed, whereas the nonvolatile memory device retains stored data even when power is removed. Therefore, nonvolatile memory devices are popular for certain applications where power conservation is of high priority, such as mobile phones, memory device cards for storing music and image data, and the like. Nonvolatile memory device types include a mask read-only memory (mask ROM), a programmable ROM (PROM), an erasable PROM (EPROM), an electrically erasable EPROM (EEPROM), a flash memory device, etc. Among them, the flash memory device is popular since it offers the advantages of both the EPROM and EEPROM.

The flash memory device can generally be classified as a flash memory device with a stacked gate structure and a flash memory device with a split gate structure. Of the two, the flash memory device with the stacked gate structure has a problem in that data are erased excessively when erasing data, whereas the flash memory device with the split gate structure overcomes this problem.

FIG. 1 is a plane view of a conventional split gate type nonvolatile memory device, and FIG. 2 is a cross-sectional view taken along the line I-I' of FIG. 1.

Referring to FIG. 1, an active region is defined on a semiconductor substrate 1 by an isolation region 2. A source region 3 and a drain region 4 are formed in the active region. Between the source and drain regions 3, 4, a floating gate 5 and a control gate 6 are formed. Herein, the source regions 3 are connected to each other in a predetermined direction so as to form a common source. The control gate 6 is formed to extend in parallel with the common source to constitute a word line. A vertical structure of the conventional split gate type nonvolatile memory device is illustrated in FIG. 2.

Referring to FIG. 2, the source region 3 and the drain region 4 are formed in the semiconductor substrate 1, and a channel is formed therebetween. A gate insulating layer 7 is formed on the semiconductor substrate 1, and the floating gate 5 is formed on a predetermined region of the gate insulating layer 7. A floating gate poly-insulating layer 8 is formed on the top surface of the floating gate 5 by a conventional local oxidation of silicon (LOCOS) method, and a tunneling insulating layer 9 is formed on one sidewall of the floating gate 5. The floating gate 5 is electrically isolated from the periphery by means of the gate insulating layer 7, the floating gate poly-insulating layer 8, and the tunneling insulating layer 9. Meanwhile, the control gate 6 is formed on the tunneling insulating layer 9 and the gate insulating layer 7, wherein the control gate 6 is disposed such that one end thereof overlaps the drain region 4, and the other end overlaps the floating gate 5.

Operation of the aforementioned nonvolatile memory device will now be briefly described. When performing a programming operation, a certain voltage is applied to the control gate 6 and the source region 3 so that channel hot electrons (CHE) penetrate from the substrate 1 through the gate insulating layer 7 and the CHE are accumulated at the floating gate 5. On the contrary, when performing an erase operation, a ground voltage is applied to both the drain region 4 and the source region 3, and a predetermined voltage is applied to the control gate 6. At this time, the electrons accumulated at the floating gate 5 penetrate through the tunneling insulating layer 9 by Fowler-Nordheim tunneling effect and they migrate into the control gate 6.

The operational characteristics with regard to the program and erase operations depend on the magnitude of the voltage coupled to the floating gate 5. As illustrated in FIG. 2, the floating gate 5, the control gate 6, and the floating gate poly-insulating layer 8 and the tunneling layer 9 interposed therebetween constitute capacitors. Likewise, the floating gate 5, the semiconductor substrate 1, and the gate insulating layer 7 interposed therebetween constitute a capacitor. As illustrated in FIG. 2, assuming that the capacitance of each capacitor to be $C_1$, $C_2$, $C_3$ and $C_4$, respectively, and the summation thereof to be Ct, i.e., $Ct=C_1+C_2+C_3+C_4$, a predetermined voltage, which is a ratio of $C_1$ to Ct multiplied by the voltage applied to the source region 3 during the program operation, is applied to the floating gate 5. Therefore, as the capacitance $C_1$ is high, the voltage applied to the floating gate 5 also becomes high so that it is possible to perform the program operation even in the case where a low voltage is applied to the source region 3. In order to increase the capacitance $C_1$, the area of the region of overlap between the floating gate 5 and the source region should be large.

Likewise, in an erase operation, if the overlapping area between the floating gate 5 and the source region 3 is relatively large, the floating gate 5 can maintain a state of a low voltage as similar to the ground voltage applied to the source region 3 for the erase operation. In this case, it is possible to maintain a high voltage difference between the control gate 6 and the floating gate 5. Moreover, in this case, Fowler-Nordheim tunneling can easily occur from the floating gate 5 into the control gate 6.

As a result, it is preferable to increase the area of overlap between the floating gate 5 and the source region 3, in order to enhance the program/erase operational characteristics. However, as the overlapping area between the floating gate 5 and the source region 3 increases, the distance between the source region 3 and the drain region 4 becomes relatively short, which can induce problems such as the short channel effect or the like. Thus, for the split-gate type nonvolatile memory device, the amount to which the overlapping area between the floating gate 5 and the source region 3 can be increased is limited.

SUMMARY OF THE INVENTION

The present invention provides a split gate type nonvolatile memory device capable of increasing an area of a region of overlap between a floating gate and a source region, while, at the same time, reducing the memory device size, and a method of fabricating the same.

In one aspect, the present invention is directed to a split gate type nonvolatile memory device comprising: a source and drain regions spaced apart from each other on a semiconductor substrate; a supplementary layer pattern on the source region; a gate insulating layer on the semiconductor substrate and the supplementary layer pattern; a floating gate on the gate insulating layer that overlaps the supplementary layer pattern and the source region; a floating gate poly-insulating layer and a tunneling insulating layer on the top surface of the floating gate and at the side surface of the floating gate, respectively; and a control gate on the floating gate poly-insulating layer and on the tunneling insulating layer.

In one embodiment, the floating gate is stepped such that it overlaps a portion of a top surface and a side surface of the supplementary layer pattern.

In another embodiment, an area of a region of the floating gate that overlaps with the top surface of the supplementary layer pattern, is larger than an area of a region of the floating gate that overlaps with the source region.

In another embodiment, the supplementary layer pattern directly contacts the source region.

In another embodiment, the supplementary layer pattern is epitaxially grown.

In another embodiment, the epitaxially grown supplementary layer pattern is formed by selective epitaxial growth.

In another embodiment, the supplementary layer pattern is formed of a conductive material.

In another embodiment, the conductive material of the supplementary layer pattern is polysilicon doped with impurity ions.

In another embodiment, a charge concentration tip is formed at an edge of the floating gate adjacent the tunneling insulating layer and the floating gate poly-insulating layer.

In another embodiment, the floating gate poly-insulating layer is formed of a silicon oxide layer.

In another embodiment, the floating gate poly-insulating layer is uniformly formed on the top surface of the floating gate.

In another embodiment, the floating gate poly-insulating layer includes a silicon oxide layer and a silicon nitride layer that are stacked in sequence.

In another aspect, the present invention is directed to a method of fabricating a split gate type nonvolatile memory device comprising: forming a supplementary layer pattern on a portion of a semiconductor substrate; forming a gate insulating layer on the semiconductor substrate and the supplementary layer pattern; forming a floating gate and a floating gate poly-insulating layer on a portion of the gate insulating layer; forming a tunneling insulating layer that covers the side surface of the floating gate; and forming a control gate on the tunneling insulating layer and the floating gate poly-insulating layer so that the control gate overlaps the floating gate.

In one embodiment, forming the floating gate and the floating gate poly-insulating layer comprises: depositing a polysilicon layer on the gate insulating layer; forming a first mask exposing a predetermined portion of the polysilicon layer; forming the floating gate poly-insulating layer by oxidizing the exposed portion of the polysilicon layer; and forming the floating gate by etching the polysilicon layer using the floating gate poly-insulating layer as a second mask after removing the first mask.

In another embodiment, the method further comprises forming a source region after forming the floating gate.

In another embodiment, the source region is formed by implanting impurity ions into the supplementary layer pattern and subsequently diffusing the impurity ions into the semiconductor substrate.

In another embodiment, forming the floating gate and the floating gate poly-insulating layer comprises: depositing a polysilicon layer on the gate insulating layer; forming an insulating layer on the polysilicon layer; forming the floating gate poly-insulating layer by etching a predetermined portion of the insulating layer; and forming the floating gate by etching the polysilicon layer using the floating gate poly-insulating layer as a mask.

In another embodiment, the floating gate poly-insulating layer comprises a stacked silicon oxide layer and a silicon nitride layer.

In another embodiment, the method further comprises forming a source region after the forming of the supplementary layer pattern and before forming the floating gate and floating gate poly-insulating layer.

In another embodiment, the source region is formed by implanting impurity ions into the. supplementary layer pattern and subsequently diffusing the impurity ions into the semiconductor substrate.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIG. 1 is a plane view of a conventional split gate type nonvolatile memory device;

FIG. 2 is a cross-sectional view taken along section line I-I' of FIG. 1;

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification. It will also be understood that when a layer is referred to as being "on" another layer or substrate, it can be directly on the other layer or substrate, or intervening layers may also be present.

Figure 3:
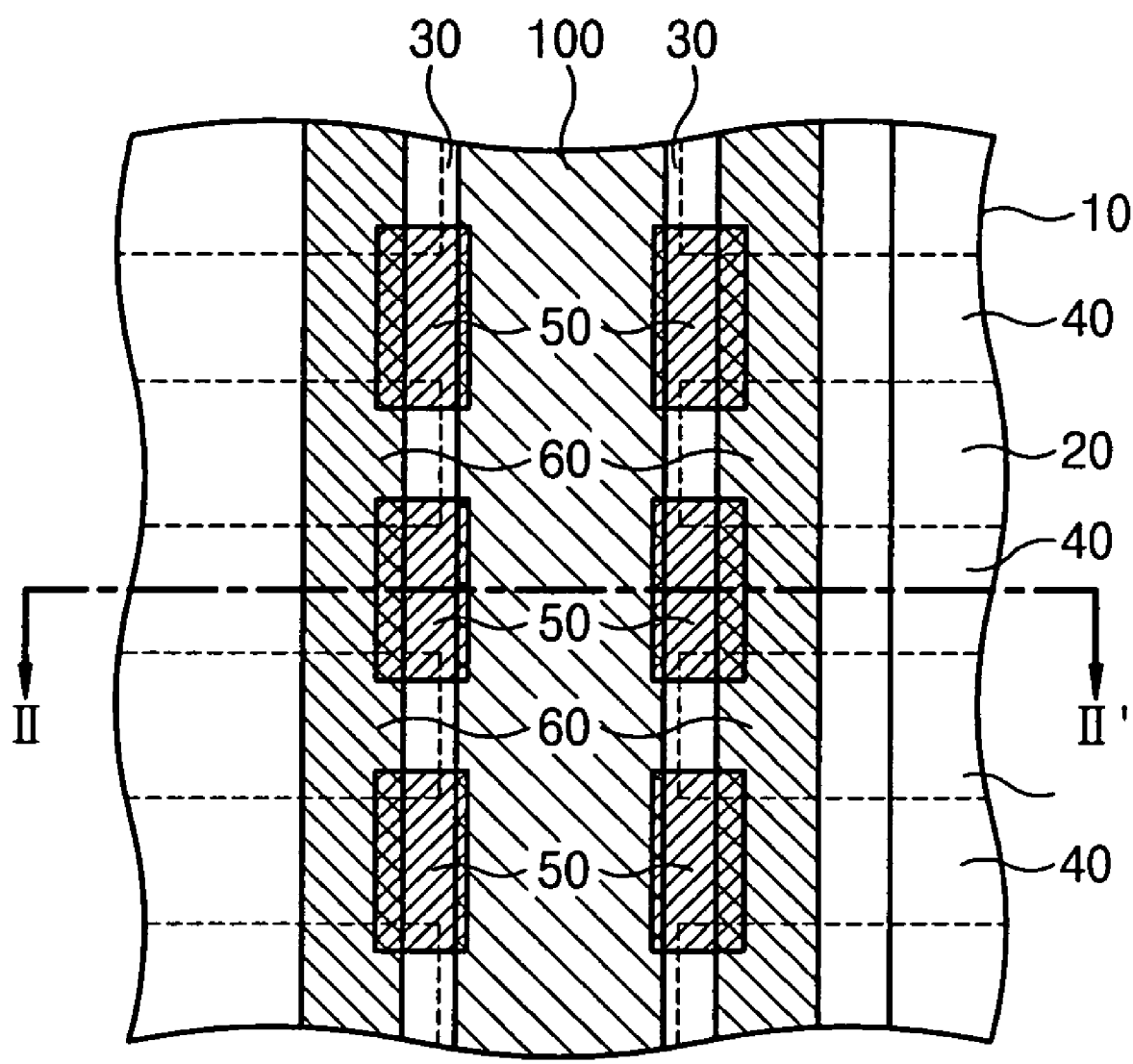
FIG. 3 is a plane view of a split gate type nonvolatile memory device according to the present invention.

FIG. 3 is a plane view of a split gate type nonvolatile memory device according to the present invention.

Referring to FIG. 3, an active region is defined on a semiconductor substrate 10 by an isolation region 20. A source region 30 and a drain region 40 are formed on the active region, and a supplementary layer pattern 100 is formed on the source region 30. The supplementary layer pattern 100, which is in contact with the source region 30, is formed on the semiconductor, substrate 10 so that the source region 30 is extended in a vertical direction by means of the supplementary layer pattern 100. Between the source and drain regions 30 and 40, the floating gate 50 and the control gate 60 are formed. The source regions 30 are connected to each other in a predetermined direction to form a common source. The control gate 60 is formed to extend in parallel with the common source so as to form a word line. A vertical structure of the split gate nonvolatile memory device of FIG. 3 is now described with reference to FIGS. 4A and 4B.

Figure 4A:
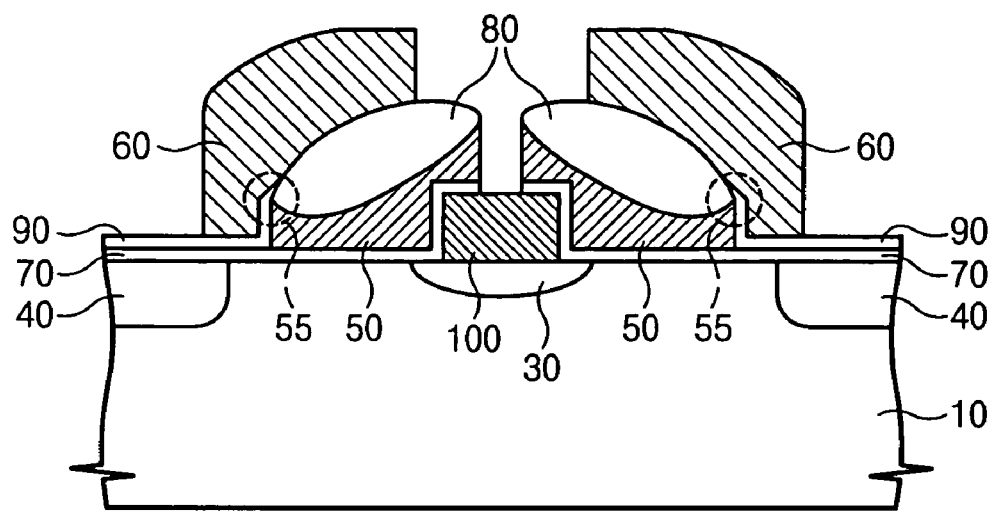
FIGS. 4A and 4B are cross-sectional views taken along section line II-II' of FIG. 3 according to embodiments of the present invention.
Figure 4B:
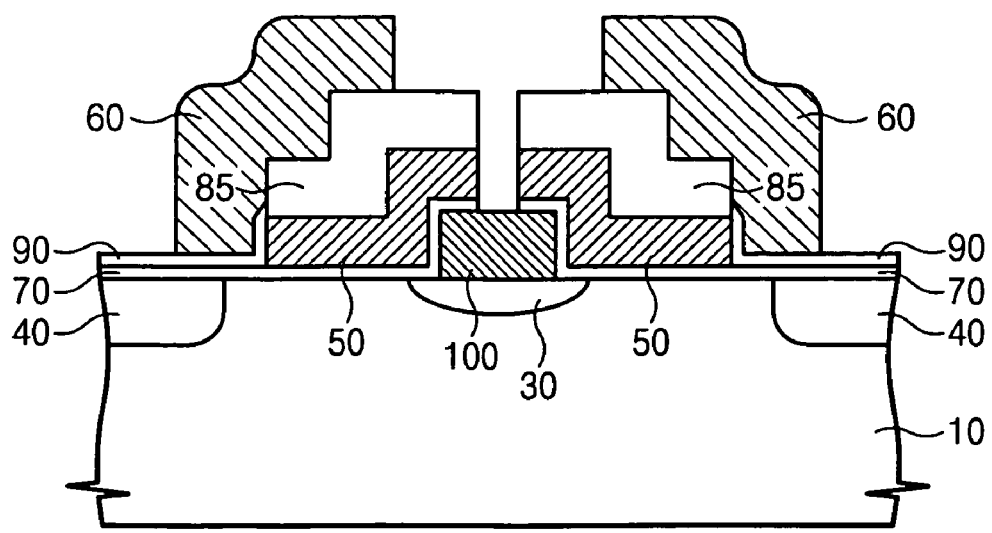

FIGS. 4A and 4B are cross-sectional views taken along section line II-II' of FIG. 3 according to embodiments of the present invention.

Referring to FIG. 4A, the source and drain regions 30, 40 are formed in the semiconductor substrate 10, and a channel is formed between the source and drain regions 30 and 40. The supplementary layer pattern 100 is formed on the source region 30. A gate insulating layer 70 is formed on the semiconductor substrate 10 and the supplementary layer pattern 100. The floating gate 50 is formed on the gate insulating layer 70, wherein the floating gate 50 is disposed on a portion of the top surface of the supplementary layer pattern 100 as well as on the channel region of the substrate 10. On one side of the floating gate 50 nearest the drain region 40, there is formed a tunneling insulating layer 90. A floating gate poly-insulating layer 80 is formed on the top surface of the floating gate 50. Therefore, the floating gate 50 is electrically isolated bout its periphery by means of the gate insulating layer 70, the floating gate poly-insulating layer 80, and the tunneling insulating layer 90. Meanwhile, the control gate 60 is formed on the tunneling insulating layer 90 and the floating gate poly-insulating layer 80. In detail, the control gate 60 is formed such that one end overlaps the drain region 40, and the other end overlaps the floating gate 50.

Increase in the amount of overlapping area between the floating gate 50 and the source region 30 in the split gate type nonvolatile memory device has many beneficial aspects. In the case of forming the supplementary layer pattern 100 of a conductive material, the supplementary layer pattern 100 and the source region 30 are in contact with each other so as to form an equipotential surface. The overlapping area between the floating gate 50 and the source region 30 is thus extended to the supplementary layer pattern 100 of which a portion overlaps with the floating gate 50. The overlapping area is greatly enlarged in this configuration, because the floating gate 50 overlaps with a side surface and the portion of the top surface of the supplementary layer pattern 100, as well as the source region 30. The beneficial effects achieved by increasing the overlapping area by virtue of employing the supplementary layer pattern 100, will be illustrated in detail more fully below.

With regard to a programming operation of the device, it is beneficial if the capacitance of the capacitor formed between the floating gate 50 and the source region 30 is increased, as illustrated and described above with reference to FIG. 2. That is, if the capacitance is high, a higher voltage is coupled to the floating gate 50 even though the same voltage is applied to the source region 30. This has the effect of accelerating a charge transfer from the semiconductor substrate 10 to the floating gate 50 during the programming operation. Typically, in a capacitor configured with two conductive materials and a dielectric material interposed therebetween, the capacitance is proportional to the area of the conductive material. When applying this principle to the capacitor configured with the source region 30, the floating gate 50, and the gate insulating layer 70 interposed therebetween, the two conductive materials correspond to the floating gate 50 and the source region 30 incorporating the supplementary layer pattern 100, and the dielectric material corresponds to the gate insulating layer 70. Therefore, by increasing the overlapping area between the floating gate 50 and the source region 30, it is possible to perform the programming operation despite a low applied voltage, since the capacitance is increased.

This principle with regard to the programming operation is also applied to an erase operation. In the erase operation, a ground voltage is applied to the source region 30 and a predetermined voltage is applied to the control gate 60 so that the electrons accumulated at the floating gate 50 move into the control gate 60 by Fowler-Nordheim tunneling. Accordingly, as the voltage difference between the control gate 60 and the floating gate 50 becomes high, the electron transfer is accelerated. If the overlapping area between the floating gate 50 and the source region 30 is increased, the floating gate 50 can maintain a low voltage that is approximate to the ground voltage applied to the source region 30. As a result, it is preferable to increase the overlapping area between the floating gate 50 and the source region 30 such that the voltage approximate to the ground voltage applied to the source region 30 can be coupled to the floating gate 50 during the program or erase operation. To this end, the split gate type nonvolatile memory device of the present invention further includes the supplementary layer pattern 100, which forms the equipotential surface with the source region 30, to thereby additionally increase the overlapping area between the floating gate 50 and the supplementary layer pattern 100. As illustrated in FIG. 4A, the floating gate 50 is formed as a pair of gates which are symmetric to each other with respect to a single, central source region 30. Since the pair of the floating gates 50 are used for storing data, respectively, the pair of the floating gates 50 should be spaced apart from each other by a predetermined distance. Because there is no particular limitation on the predetermined distance between the pair of the floating gates 50, the predetermined distance can be slightly increased or decreased. As the predetermined distance between the pair of the floating gates 50 becomes smaller, this is beneficial to the memory device because it is possible to increase the area of the region where the floating gate 50 and the supplementary layer pattern 100 overlap with each other. By increasing the overlapping area between the floating gate 50 and the supplementary layer pattern 100, there may occur various problems such as a short channel effect or the like because the source and drain regions 30 and 40 become too close to each other, as described above. According to the present invention, it is possible to increase the amount of area of overlap at the side surface of the supplementary layer pattern 100 by increasing the thickness of the supplementary layer pattern 100. In this manner, the area of overlap between the floating gate 50 and the supplementary layer pattern 100 is increased, providing increased capacitance therebetween. At the same time, the size of the floating gate 50 or the area where the source region 30 is formed can be reduced, to advantageously reduce the total size of the memory device.

FIG. 4B is a cross-sectional view illustrating a nonvolatile memory device according to another embodiment of the present invention. In comparison with the memory device of FIG. 4A, the primary difference is related to the floating gate poly-insulating layer 85 formed on the top surface of the floating gate 50.

In FIG. 4A, the floating gate poly-insulating layer 80 is nonuniformly formed on the top surface of the floating gate 50 and it is slightly inclined. Herein, the floating gate poly-insulating layer 80 is formed of silicon oxide by oxidizing the floating gate 50. A tip 55 is formed at a region where the floating gate poly-insulating layer 80 and the tunneling insulating layer 90 are adjacent to each other in order that Fowler-Nordheim tunneling can occur with ease and that electrons can be concentrated thereon. In comparison with this, in the embodiment of FIG. 4B, the floating gate poly-insulating layer 85 is formed such that it covers the top surface of the floating gate 50. In this example, the floating gate poly-insulating layer 85 can be formed by stacking a silicon oxide layer and a silicon nitride layer. Meanwhile, a sharp tip is not formed in the floating gate 50 of the embodiment of FIG. 4B, unlike the embodiment of FIG. 4A. Therefore, the memory device of FIG. 4A has an advantage from the perspective of operational characteristics, whereas the memory device of FIG. 4B has a merit from the perspective of the fabrication process. A method of fabricating the above memory devices of FIGS. 4A and 4B will be illustrated with reference to the drawings herebelow.

FIGS. 5A to 5F are cross-sectional views illustrating a method of fabricating the memory device of FIG. 4A.

Figure 5A:
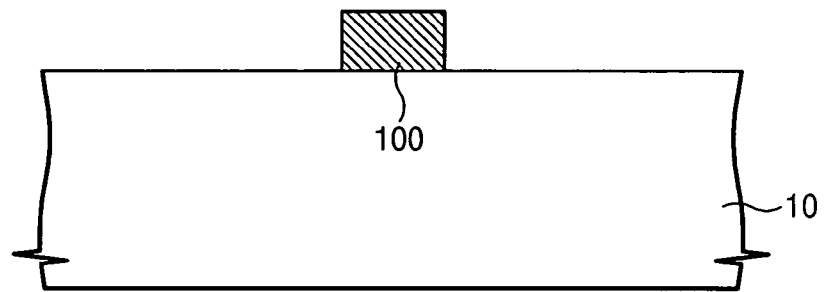
FIGS. 5A to 5F are cross-sectional views illustrating a method of fabricating the split gate type nonvolatile memory device of FIG. 4A.

Referring to FIG. 5A, the supplementary layer pattern 100 is formed on the semiconductor substrate 10. The supplementary layer pattern 100 forms an equipotential surface with the later-formed underlying source region 30. It is preferable that the supplementary layer pattern 100 be formed of a conductive material, e.g., particularly a polysilicon doped with impurities, in consideration of the fabrication process. In the case of employing the polysilicon, a polysilicon layer may be formed on an entire surface of the semiconductor substrate 10 and may be patterned so as to form the supplementary layer pattern 100. Alternatively, a selective epitaxial growth (SEG) process is performed over the region where the supplementary layer pattern 100 is formed, to thereby form the supplementary layer pattern 100 protruding, or extending in a vertical direction, from the surface of the substrate 10.

Figure 5B:
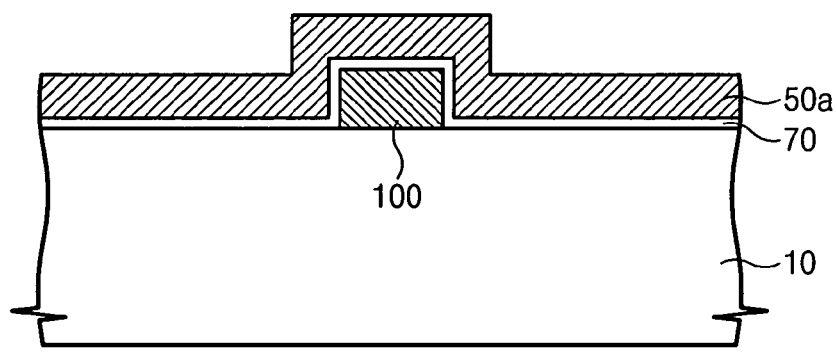

Referring to FIG. 5B, the gate insulating layer 70 is formed on the semiconductor substrate 10 and the supplementary layer pattern 100. Subsequently, a polysilicon layer 50a for a floating gate is formed on the gate insulating layer 70. The gate insulating layer 70 may be formed using a thermal oxidation process. Herein, if the supplementary layer pattern 100 employs polysilicon, there is formed an oxide layer on the side surface and the top surface of the supplementary layer pattern 100.

Figure 5C:
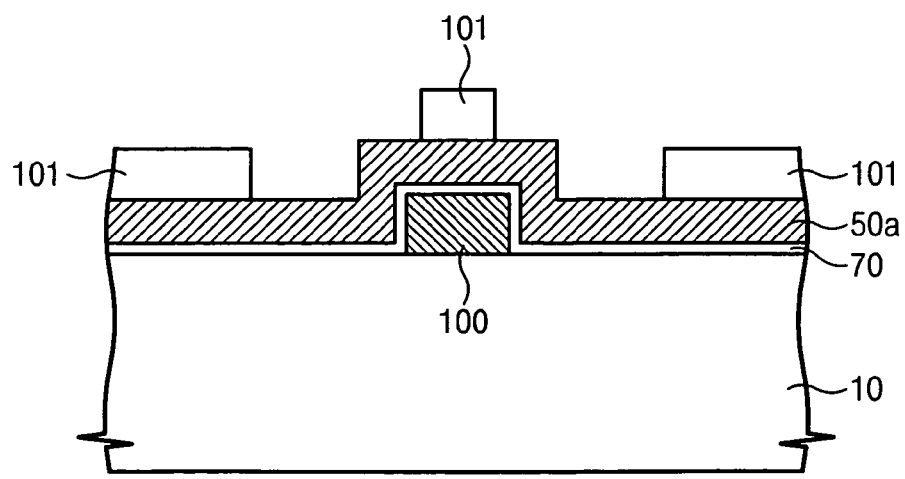

Referring to FIG. 5C, a mask 101 exposing a predetermined region of the polysilicon layer 50a is formed on the polysilicon layer 50a. The mask 101 may be formed by depositing a silicon nitride layer and patterning it into a predetermined configuration. The region of the polysilicon layer 50a exposed by the mask 101 corresponds to a region where the floating gate poly-insulating layer and the floating gate will be formed. It is possible to reduce the stress generated by the silicon nitride layer by forming a silicon oxide layer between the silicon nitride layer and the polysilicon layer 50a.

Figure 5D:
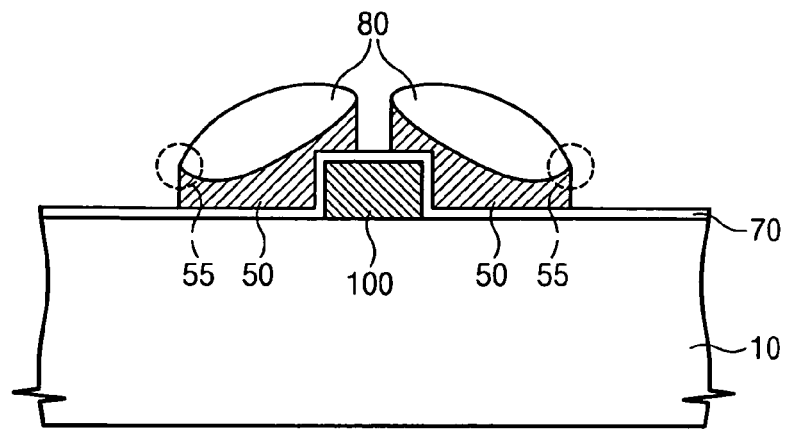

Referring to FIG. 5D, an oxidation process is performed to form the floating gate poly-insulating layer 80 on the region of the polysilicon layer 50a exposed by the mask 101. The mask 101 is formed of the silicon nitride so that the oxide layer is not formed on the mask 101. Silicon atoms in the polysilicon layer 50a uncovered by the mask 101 react with oxygen atoms during the oxidation process so as to form the oxide layer. Thereafter, the mask 101 is removed and simultaneously the polysilicon layer 50a under the mask 101 is also removed, to thereby form the floating gate 50. Since the region uncovered by the mask 101 determines the location where the floating gate 50 is formed, it is possible to increase the area of overlap between the floating gate 50 and the supplementary layer pattern 100 larger by increasing the amount of exposure of the top surface of the polysilicon layer 50a. The lower surface of the floating gate 50 is formed in a shape of a step along the top surface and one side surface of the supplementary layer pattern 100. The floating gate poly-insulating layer 80 is formed such that it is not flat but rather has a somewhat inclined surface. In addition, the oxidation process is not performed over the entire surface of the polysilicon layer 50a but rather is performed in a predetermined portion that is exposed by the mask 101. Therefore, as illustrated in FIG. 5D, a tip 55 is formed at an edge of the floating gate 50 due to the floating gate poly-insulating layer 80. During an erase operation, electrons are concentrated at the tip 55 so that the Fowler-Nordheim tunneling may readily occur, even if a relatively low voltage is applied during the erase operation.

Figure 5E:
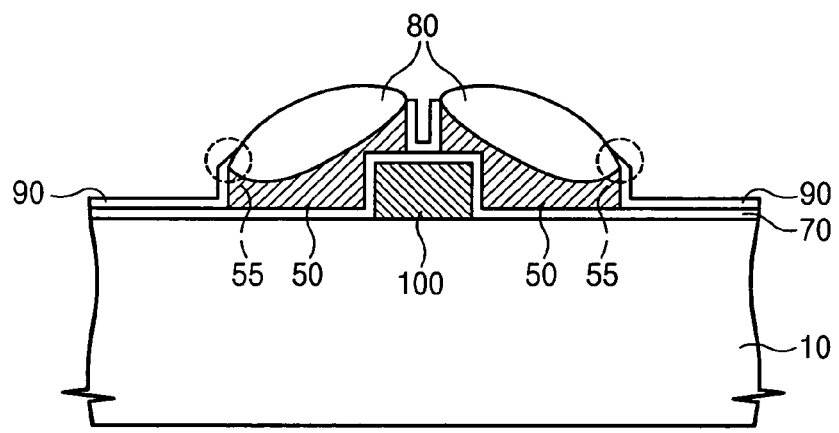

Referring to FIG. 5E, the tunneling oxide layer 90 is formed over the semiconductor substrate 10 where the floating gate 50 and the floating gate poly-insulating layer 80 are formed. In case that the tunneling oxide layer 90 is formed using the thermal oxidation, the oxidation occurs also on both sides of the floating gate 50. In addition, since the gate insulating layer 70 is formed to be relatively thin, i.e., in tens of angstroms thick, the tunneling insulating layer 90 can be formed on the gate insulating layer 70. Since the floating gate poly-insulting layer 80 is formed to be relatively thick, i.e., in 900~1,200 angstroms thick, the top surface of the poly-insulating layer 80 is minimally oxidized. Meanwhile, if the thickness of the tunneling oxide layer 90 formed through the thermal oxidation is not sufficient, a chemical vapor deposition (CVD) process is additionally performed. At this time, an oxide layer may be deposited on the floating gate poly-insulating layer 80. A portion of the tunneling oxide layer 90 is removed during a following process.

Figure 5F:
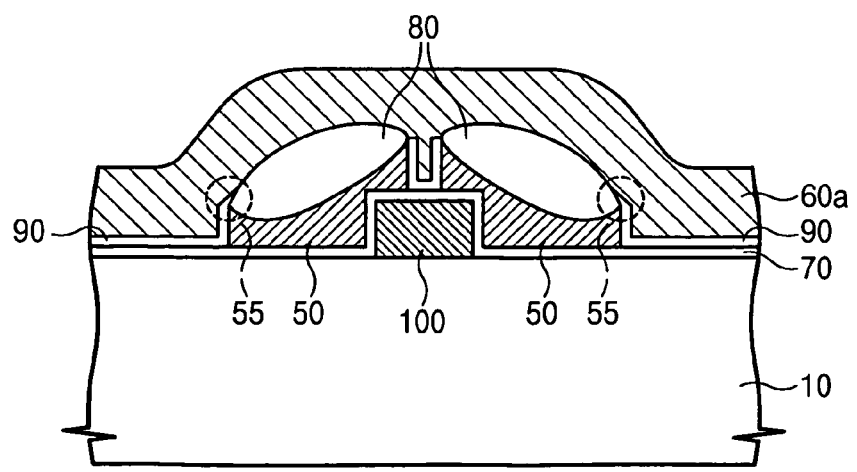

Referring to FIG. 5F, after forming the tunneling insulating layer, a polysilicon layer 60a for a control gate is formed on the tunneling insulating layer 90. Afterwards, the polysilicon layer 60a is patterned to form the control gate. Thereafter, typical processes are further performed so as to complete the split-gate type nonvolatile memory device of FIG. 4A.

In the method of fabricating the split gate type nonvolatile memory device of FIG. 4A with reference to FIGS. 5A to 5F, an impurity ion implantation process is additionally performed to form the source/drain regions. In the case where the supplementary layer pattern 100 is formed of polysilicon, the impurity ions are also implanted into the supplementary layer pattern 100 so that it operates as a source extension region. Referring back to FIG. 4A, since the supplementary layer pattern 100 and the source region 30 are in contact with each other, the source region 30 can be formed by diffusing the impurity ions into the substrate 10 to form the source region 30 after implanting the impurity ions into the supplementary layer pattern 100, immediately following formation of the floating gate poly-insulating layer 80. This is because that if the source region 30 is formed prior to forming the floating gate poly-insulating layer 80, further impurity ion diffusion can occur during the high thermal oxidation used for forming the poly-insulating layer 80. Such additional diffusion can cause the prior-formed source region 30 to extend into other regions. Accordingly, in this embodiment, after forming the floating gate poly-insulating layer 80, the source region 30 is formed by implanting the impurity ions into the supplementary layer pattern 100 using a separate mask, followed-by inducing ion diffusion into the substrate to form the source region 30.

A method of fabricating the split gate type nonvolatile memory device of FIG. 4B will now be described with reference to the cross-sectional views of FIGS. 6A to 6D.

Initially, the processes of FIGS. 5A and 5B are performed. That is, the supplementary layer pattern 100 is formed on the semiconductor substrate 10, and the gate insulating layer 70 and the polysilicon layer 50a for the floating gate are formed on the resultant structure in sequence. Thereafter, referring to FIG. 6A, an insulating material is deposited on the top surface of the polysilicon layer 50a and is patterned to form the floating gate poly-insulating layer 85. The insulating material for the floating gate poly-insulating layer 85 may employ a silicon-nitride layer. Alternatively, a silicon oxide layer may be additionally formed in order to avoid a direct contact between the silicon nitride layer and the polysilicon layer, so as to reduce stress that is induced by the silicon nitride layer.

Figure 6A:
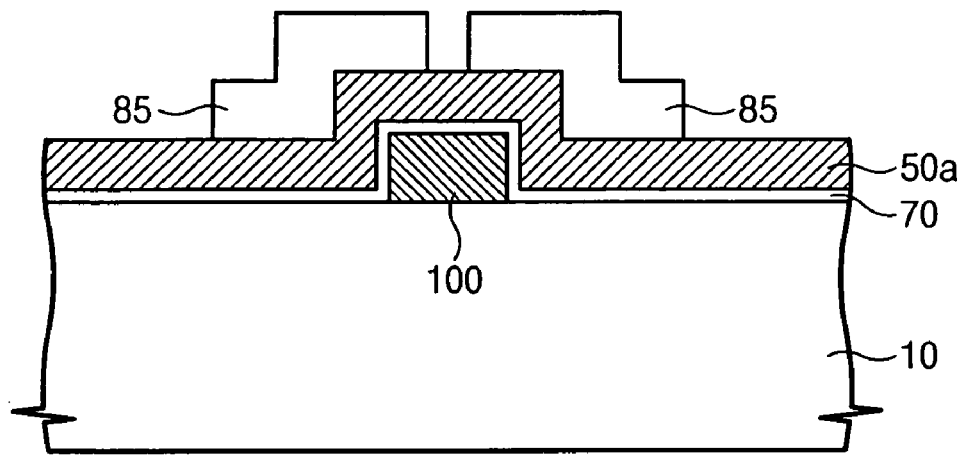
FIGS. 6A to 6D are cross-sectional views illustrating a method of fabricating the split gate type nonvolatile memory device of FIG. 4B.
Figure 6B:
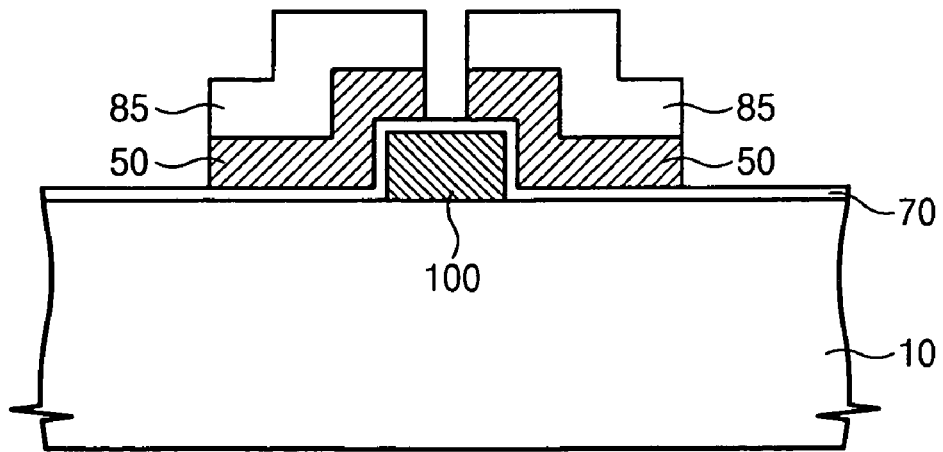

Referring to FIG. 6B, the polysilicon layer 50a is etched using the floating gate poly-insulating layer 85 as an etch mask so as to form the floating gate 50. Herein, in order to enlarge the overlap area between the floating gate 50 and the supplementary layer pattern 100, the floating gate poly-insulating layer 85 is patterned such that it is formed to largely cover a portion of the top surface of the supplementary layer pattern 100.

Figure 6C:
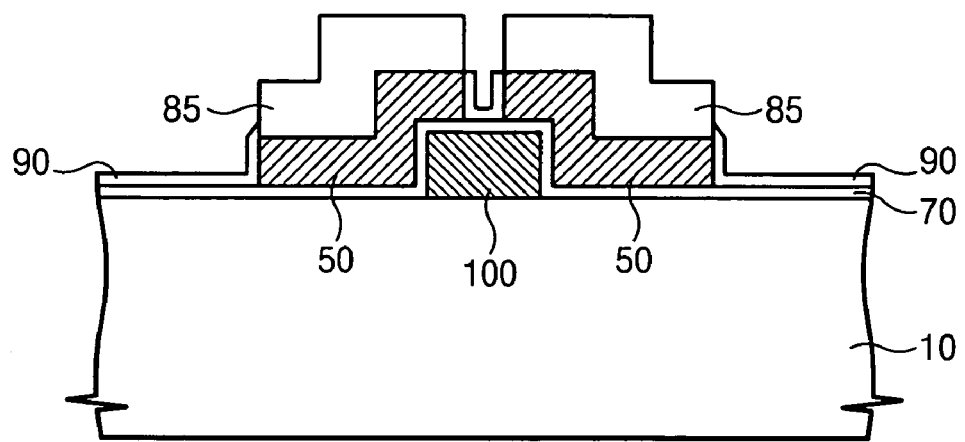

Referring to FIG. 6C, the tunneling insulating layer 90 is formed on the semiconductor substrate where the floating gate 50 and the floating gate poly-insulating layer 85 are formed. The tunneling insulating layer 90 may be formed of silicon oxide using the thermal oxidation. In this case, the oxidation primarily occurs on both sides of the floating gate 50, but does not occur on the top surface of the floating gate poly-insulating layer 85 because the floating gate poly-insulating layer 85 is formed of the silicon nitride layer.

Figure 6D:
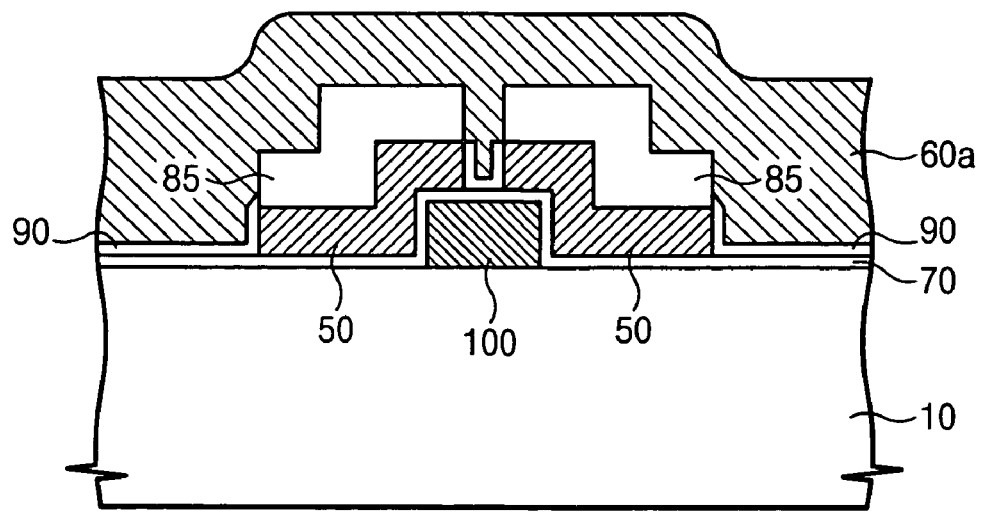

Referring to FIG. 6D, a polysilicon layer 60a for a control gate is deposited on the resultant structure after forming the tunneling oxide layer 90. Afterwards, typical processes such as the process of patterning the polysilicon layer 60a, and the like, are performed so as to complete the split gate type nonvolatile memory device of FIG. 4B.

Referring back to FIG. 4B, the thick thermal oxide layer 80 of the FIG. 4A embodiment is not used as the floating gate poly-insulating layer 85 in this embodiment. Accordingly, the forming of the source region 30 is not necessarily performed after forming of the floating gate poly-insulating layer 85. However, after forming the floating gate poly-insulating layer 85, the layer 85 partially covers the top surface of the supplementary layer pattern 100. Therefore, when the impurity ions are implanted, the impurity ions are implanted throughout the entire region of the supplementary layer pattern 100. In comparison with this, if implanting the impurity ions soon after forming the supplementary layer pattern 100 on the semiconductor substrate 10 for example following the process of FIG. 5A above, the entire surface of the supplementary layer pattern 100 is exposed so that implantation of impurity ions can be readily performed at that time.

Although there is illustrated the method of fabricating the split gate type nonvolatile memory device of FIG. 4A or 4B, the illustrated method is one of various methods capable of implementing the structure of the memory device of FIG. 4A or 4B. Thus, it is not necessary that the split gate type nonvolatile memory device be fabricated using only the methods illustrated in FIGS. 5A to 5F, or FIGS. 6A to 6D.

As described above, according to the split gate type nonvolatile memory device of the present invention and the method of fabricating the same, it is possible for the split gate type nonvolatile memory device to perform the program/erase operation at a relatively low voltage level, in comparison with the prior art. In addition, since the overlapping area between the source region and the floating gate is effectively reduced, the present invention is effective for reducing the total size of the memory device.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A split gate type nonvolatile memory device comprising: source and drain regions spaced apart from each other on a semiconductor substrate;
   a supplementary layer pattern on the source region;
   a gate insulating layer on the semiconductor substrate and top and side surfaces of the supplementary layer pattern;
   a floating gate on the gate insulating layer at top and side surfaces of the supplementary layer pattern and isolated from the supplementary layer pattern by the gate insulating layer, the floating gate overlapping the supplementary layer pattern and the source region, such that a capacitance between the floating gate and the supplementary layer pattern is determined by an interface area between the floating gate and the top and side surfaces of the supplementary layer pattern;
   a floating gate poly-insulating layer and a tunneling insulating layer on the top surface of the floating gate and at the side surface of the floating gate, respectively; and
   a control gate on the floating gate poly-insulating layer and on the tunneling insulating layer.

2. The split gate type nonvolatile memory device of claim 1, wherein the floating gate is stepped such that it overlaps a portion of a top surface and a side surface of the supplementary layer pattern.

3. The split gate type nonvolatile memory device of claim 2, wherein an area of a region of the floating gate that overlaps with the top surface of the supplementary layer pattern, is larger than an area of a region of the floating gate that overlaps with the source region.

4. The split gate type nonvolatile memory device of claim 1, wherein the supplementary layer pattern directly contacts the source region.

5. The split gate type nonvolatile memory device of claim 1, wherein the supplementary layer pattern is epitaxially grown.

6. The split gate type nonvolatile memory device of claim 5, wherein the epitaxially grown supplementary layer pattern is formed by selective epitaxial growth.

7. The split gate type nonvolatile memory device of claim 1, wherein the supplementary layer pattern is formed of a conductive material.

8. The split gate type nonvolatile memory device of claim 7, wherein the conductive material of the supplementary layer pattern is polysilicon doped with impurity ions.

9. The split gate type nonvolatile memory device of claim 1, wherein a charge concentration tip is formed at an edge of the floating gate adjacent the tunneling insulating layer and the floating gate poly-insulating layer.

10. The split gate type nonvolatile memory device of claim 9, wherein the floating gate poly-insulating layer is formed of a silicon oxide layer.

11. The split gate type nonvolatile memory device of claim 1, wherein the floating gate poly-insulating layer is uniformly formed on the top surface of the floating gate.

12. The split gate type nonvolatile memory device of claim 11, wherein the floating gate poly-insulating layer includes a silicon oxide layer and a silicon nitride layer that are stacked in sequence.

* * * * *